United States Patent
Shaw et al.

(10) Patent No.: US 12,009,181 B2
(45) Date of Patent: Jun. 11, 2024

(54) MATCH EFFICIENCY-VARIATION COMPENSATION

(71) Applicant: Advanced Energy Industries, Inc., Fort Collins, CO (US)

(72) Inventors: Denis Shaw, Fort Collins, CO (US); Holger Philipp Kley, Fort Collins, CO (US); Suryan Emani, San Jose, CA (US)

(73) Assignee: Advanced Energy Industries, Inc., Denver, CO (US)

( * ) Notice: Subject to any disclaimer, the term of this patent is extended or adjusted under 35 U.S.C. 154(b) by 189 days.

(21) Appl. No.: 17/524,659

(22) Filed: Nov. 11, 2021

(65) Prior Publication Data

US 2022/0181121 A1    Jun. 9, 2022

Related U.S. Application Data

(60) Provisional application No. 63/113,154, filed on Nov. 12, 2020.

(51) Int. Cl.
*H03H 7/40* (2006.01)
*H01J 37/32* (2006.01)
*H03H 7/38* (2006.01)

(52) U.S. Cl.
CPC ......... *H01J 37/32183* (2013.01); *H03H 7/38* (2013.01); *H03H 7/40* (2013.01)

(58) Field of Classification Search
CPC ....... H03H 7/38; H03H 7/40; H01J 37/32183; H01J 37/32926
See application file for complete search history.

(56) References Cited

U.S. PATENT DOCUMENTS

| 5,195,045 A | 3/1993 | Keane et al. |
|---|---|---|
| 6,887,339 B1 | 5/2005 | Goodman et al. |
| 10,431,428 B2 | 10/2019 | Bhutta et al. |
| 10,943,770 B2 | 3/2021 | Van Greunen et al. |
| 2012/0188007 A1 | 7/2012 | Van Zyl et al. |
| 2014/0118205 A1 | 5/2014 | du Toit et al. |
| 2020/0373128 A1* | 11/2020 | Ulrich .............. H01L 22/26 |

OTHER PUBLICATIONS

International Search Report and Written Opinion received for International PCT Application Serial No. PCT/US2021/059027, dated Apr. 7, 2022, 16 pages.
Nora Lindner, International Search Report, dated Nov. 11, 2021, The International Bureau of WIPO, Switzerland.

* cited by examiner

*Primary Examiner* — Stephen E. Jones
(74) *Attorney, Agent, or Firm* — Neugeboren O'Dowd PC

(57) ABSTRACT

This disclosure describes systems, methods, and apparatus for identifying and compensating for variances between match networks. Each match network can be calibrated at the factory against a golden load and a reference load to turn a generalized model of the match network into an operation model. The operation model can be stored with the match network or shipped with the match network, and used by an operator to determine a correction factor during processing. This correction factor can be used to adjust a generator setpoint, frequency, or aspects of the match network.

17 Claims, 12 Drawing Sheets

| P_O | P_B | Golden Load Fixture | Calculated Power P_A | Match Efficiency | Correction Factor |
|---|---|---|---|---|---|
| 1000.0 | 815.0 | 97.00% | 840.2 | 84.54% | 1.0062 |
| 1000.0 | 816.0 | 97.00% | 841.2 | 84.54% | 1.0049 |
| 1000.0 | 817.0 | 97.00% | 842.3 | 84.54% | 1.0037 |
| 1000.0 | 818.0 | 97.00% | 843.3 | 84.54% | 1.0025 |
| 1000.0 | 819.0 | 97.00% | 844.3 | 84.54% | 1.0013 |
| 1000.0 | 820.0 | 97.00% | 845.4 | 84.54% | 1.0000 |
| 1000.0 | 821.0 | 97.00% | 846.4 | 84.54% | 0.9988 |
| 1000.0 | 822.0 | 97.00% | 847.4 | 84.54% | 0.9976 |
| 1000.0 | 823.0 | 97.00% | 848.5 | 84.54% | 0.9964 |
| 1000.0 | 824.0 | 97.00% | 849.5 | 84.54% | 0.9952 |
| 1000.0 | 825.0 | 97.00% | 850.5 | 84.54% | 0.9940 |

Avg Modeled Power/$P_A$ — Adjust Power Setpoint by Correction Factor

FIG. 9

MATCH EFFICIENCY-VARIATION COMPENSATION

CLAIM OF PRIORITY UNDER 35 U.S.C. § 119

The present Application for Patent claims priority to Provisional Application No. 63/113,154 entitled "MATCH EFFICIENCY VARIATION COMPENSATION" filed Nov. 12, 2020, and assigned to the assignee hereof and hereby expressly incorporated by reference herein.

FIELD OF THE DISCLOSURE

The present disclosure relates generally to power systems. In particular, but not by way of limitation, the present disclosure relates to systems, methods and apparatuses for applying power transmitted from a generator to a load.

DESCRIPTION OF RELATED ART

In the context of plasma processing, manufacturers produce plasma processing chambers that utilize power (e.g., RF power) to generate a plasma. In order to achieve efficient power transfer between a generator and a plasma load, an impedance-matching network ("match network") is often used to match the load impedance to a desired input impedance, typically (although not always) 50 ohms. Plasma load impedance may vary depending on variables such as generator frequency, power, chamber pressure, gas composition, and plasma ignition. The match network accounts for these variations in load impedance by varying reactive elements (e.g., variable capacitors) to maintain the desired input impedance.

SUMMARY OF THE DISCLOSURE

Similar to most electrical components, match networks are not 100% efficient at transferring power to a load. Moreover, the inventors have discovered that efficiency of each match network may vary, and as a consequence, different levels of power may be applied to the load with different match networks even though the power applied by the generator remains the same. Further complicating matters is the fact that efficiency of a match network may vary over the operating range of the match network. Operators of plasma processing systems desire consistent levels of power to achieve consistent processing results (e.g., consistent rates of etch or deposition). As a consequence, current match networks are often unsatisfactory; thus, a need exists for a solution to the problem created by match network efficiency variation.

FIG. 1 illustrates a known plasma processing system including a generator 102, match network 104, and a plasma chamber 105. Chip manufacturers and others that use the plasma processing chamber 105 powered by a generator 102 through a match network 104 have run up against identical systems 100 that produce different deposition or etch rates in the chamber 105. In other words, two parallel systems 100 with identical model numbers for the generators 102 and the match networks 104, and running identical recipes, can still see variations in processing characteristics. Manufacturers of the generator 102 and the match network 104 have tried to identify a cause of these issues, but have not identified the cause or provided a viable solution for users of these systems 100.

Most manufacturers on the power side of the system 100 either produce the generator 102 or the match network 104, but not both. The inventors are in the unique position of designing and building systems that include both the generator 102 and the match network 104 and accordingly were afforded a unique perspective on the above-noted problem. They theorized that identical match networks 104 might actually have difficult-to-characterize variations, such as different Q factors in the inductors. With this theory in hand, they set out to calibrate seemingly-identical match networks 204 against each other. Specifically, they developed a golden load fixture 206 having a specific and consistent resistance and reactance (i.e., complex impedance) that, when arranged between a given one of the match networks 204 and a reference load 210, such as a 50 Ohm reference load, could be used in a factory-based calibration of every match to determine an operation model $E\_u(C,f)$ that could be used during customer processing to calculate a correction factor $\varepsilon$. C represents the array of $C_1$ to $C_K$. The generator 201 and match network 204, with the operation model $E\_u(C,f)$ stored thereon or stored on an external controller, can be shipped to the customer and used during processing recipes with a plasma chamber to remove variances between match networks 204. In operation the golden load fixture 206 and optionally the generator 201 can be coupled into a plasma processing system as shown in FIGS. 3-5.

The following presents a simplified summary relating to one or more aspects and/or embodiments disclosed herein. As such, the following summary should not be considered an extensive overview relating to all contemplated aspects and/or embodiments, nor should the following summary be regarded to identify key or critical elements relating to all contemplated aspects and/or embodiments or to delineate the scope associated with any particular aspect and/or embodiment. Accordingly, the following summary has the sole purpose to present certain concepts relating to one or more aspects and/or embodiments relating to the mechanisms disclosed herein in a simplified form to precede the detailed description presented below.

Other embodiments of the disclosure can be characterized as a system including a generator, match network u, an operation model, $E\_u(C,f)$, and a correction component. The match network u includes an input coupled to the generator, an output configured for electrical coupling to a plasma load within a plasma chamber, and variable reactance components with variable positions described by states, $C_1$ to $C_K$. The operation model, $E\_u(C,f)$, characterizes a deviation from nominal of the match network u over its operating range. The operation model, $E\_u(C,f)$ can have parameters, $p_1$ to $p_L$, determined via calibration using one or more golden load fixtures, the states $C_1$ to $C_K$, and one or more generator frequencies, f. The correction component can be configured to, during a processing recipe of the generator and the match network u, access an operating frequency, f', of the generator; access the states, $C_1$ to $C_K$, after the match network u has been tuned for the plasma load; input the operation frequency, f', as well as the states, $C_1$ to $C_K$, to the operation model, $E\_u(C,f)$, to generate a correction factor $\varepsilon$; and instruct the generator and/or match network u to adjust based on the correction factor $\varepsilon$. Additional correction factors can be determined as the match tunes throughout a recipe.

Some embodiments of the disclosure may be characterized a method including for M combinations of golden load fixtures and test generator frequencies f, where M is equal to or greater than L, generating a set of M constraints by: applying power from the test generator to a selected one of the golden load fixtures through a match network at a selected one of the frequencies f; tuning the match network to the selected one of the golden load fixtures in series with a reference load; measuring an input characteristic between the test generator and the match network; measuring an output characteristic after the selected one of the golden load fixtures; using the input and output characteristics to extrapolate an intermediate characteristic between the match network and the selected one of the golden load fixtures; calculating one or more characteristics of the match network for a selected one of the M combinations based on the input characteristic, the intermediate characteristic, and the output characteristic; and using the one or more characteristics of the match network for the selected one of the M combinations to form one of the M constraints. The method then estimates the parameters, $p_1$ to $p_L$, of the generalized model $E(p,C,f)$ based on the M constraints to give an operation model $E\_u(C,f)$ in terms of the parameters $p_1$ to $p_L$, and having inputs $C_1$ to $C_K$ and f, of a process generator, the operation model $E\_u(C,f)$ describing the match network's deviation from nominal over its operating range.

Other embodiments of the disclosure may also be characterized as a non-transitory, tangible computer readable storage medium, encoded with processor readable instructions to perform a method for identifying M constraints that can be used to form an operation model of a match network that accounts for variances from nominal, the method comprising, for M combinations of golden load fixtures and test generator frequencies f, where M is equal to or greater than L, generating a set of M constraints by: applying power from the test generator to a selected one of the golden load fixtures through a match network at a selected one of the frequencies f; tuning the match network to the selected one of the golden load fixtures and a reference load; measuring an input characteristic between the test generator and the match network; measuring an output characteristic after the selected one of the golden load fixtures; using the input and output characteristics to extrapolate an intermediate characteristic between the match network and the selected one of the golden load fixtures; calculating one or more characteristics of the match network for a selected one of the M combinations based on the input characteristic, the intermediate characteristic, and the output characteristic.

BRIEF DESCRIPTION OF THE DRAWINGS

Various objects and advantages and a more complete understanding of the present disclosure are apparent and more readily appreciated by referring to the following detailed description and to the appended claims when taken in conjunction with the accompanying drawings:

FIG. 9 illustrates a table of exemplary values measured and calculated where the characteristic of the match network was efficiency;

DETAILED DESCRIPTION

Figure 1:
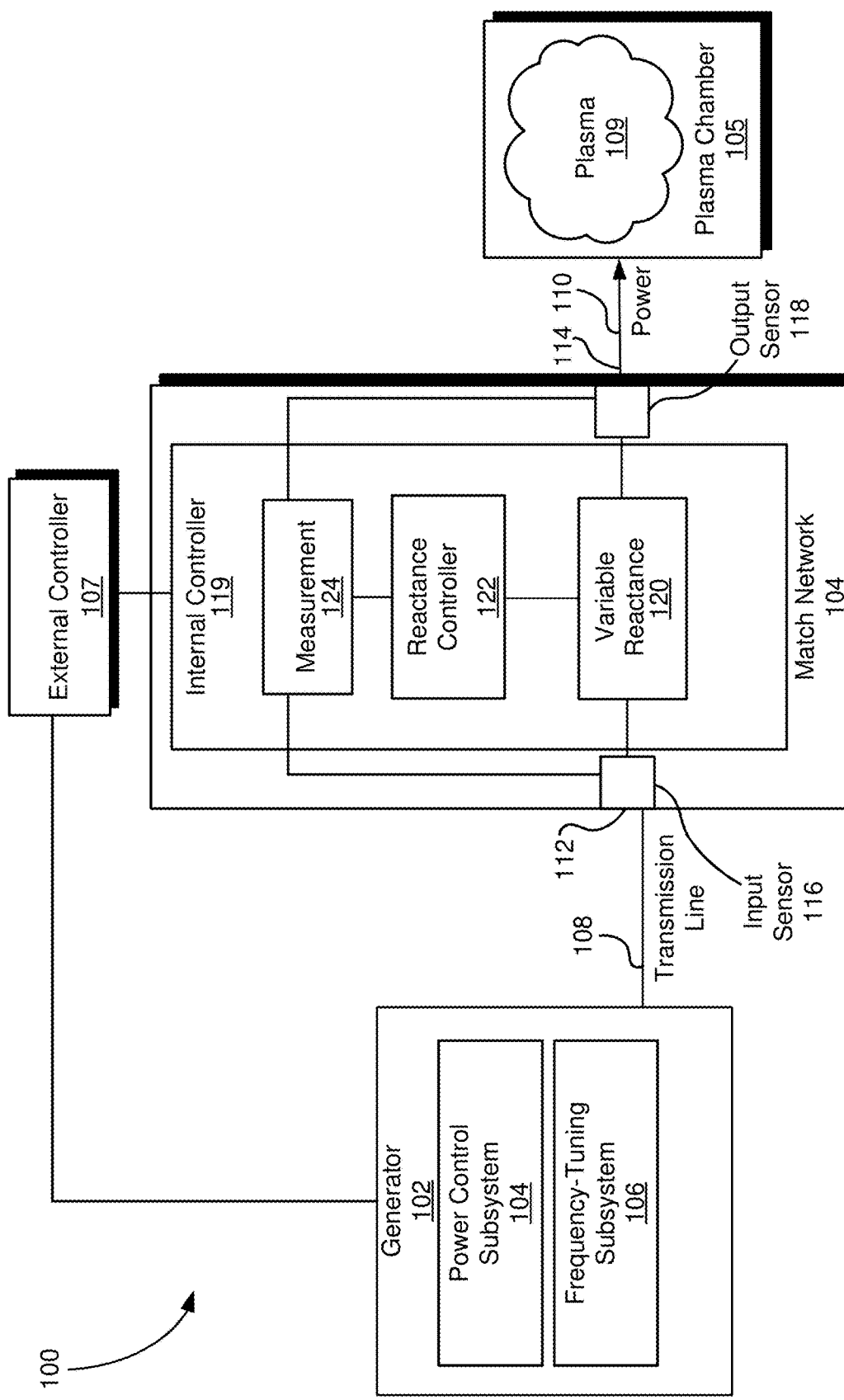
FIG. 1 illustrates a known plasma processing system including a generator, match network, and a plasma chamber.

The word "exemplary" is used herein to mean "serving as an example, instance, or illustration." Any embodiment described herein as "exemplary" is not necessarily to be construed as preferred or advantageous over other embodiments.

Preliminary note: the flowcharts and block diagrams in the following Figures illustrate the architecture, functionality, and operation of possible implementations of systems, methods and computer program products according to various embodiments of the present disclosure. In this regard, some blocks in these flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under"

can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items, and may be abbreviated as "/".

It will be understood that when an element or layer is referred to as being "on," "connected to," "coupled to," or "adjacent to" another element or layer, it can be directly on, connected, coupled, or adjacent to the other element or layer, or intervening elements or layers may be present. In contrast, when an element is referred to as being "directly on," "directly connected to," "directly coupled to," or "immediately adjacent to" another element or layer, there are no intervening elements or layers present.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Existing plasma processing systems, such as that shown in FIG. 1 often include a generator 102 and a match network 104. In operation, the generator 102 applies power (e.g., RF power) to the match network 104 via a transmission line 108 (e.g., coaxial cable) and then onto a load via an electrical connection 110. As discussed further herein, the generator 102 may be realized by a variety of different types of generators that may operate at a variety of different power levels and frequencies. And as discussed above, the match network 104 functions to transform an impedance at an output of the match network 104 to an impedance that is presented to the transmission line 108 at an input 112 of the match network 104. The system 100 may use an external controller 107 (or an internal controller) to tune the match network 104 based on the generator 102 setpoint and frequency as well as measurements from the input sensor 116 and the output sensor 118.

Figure 2:
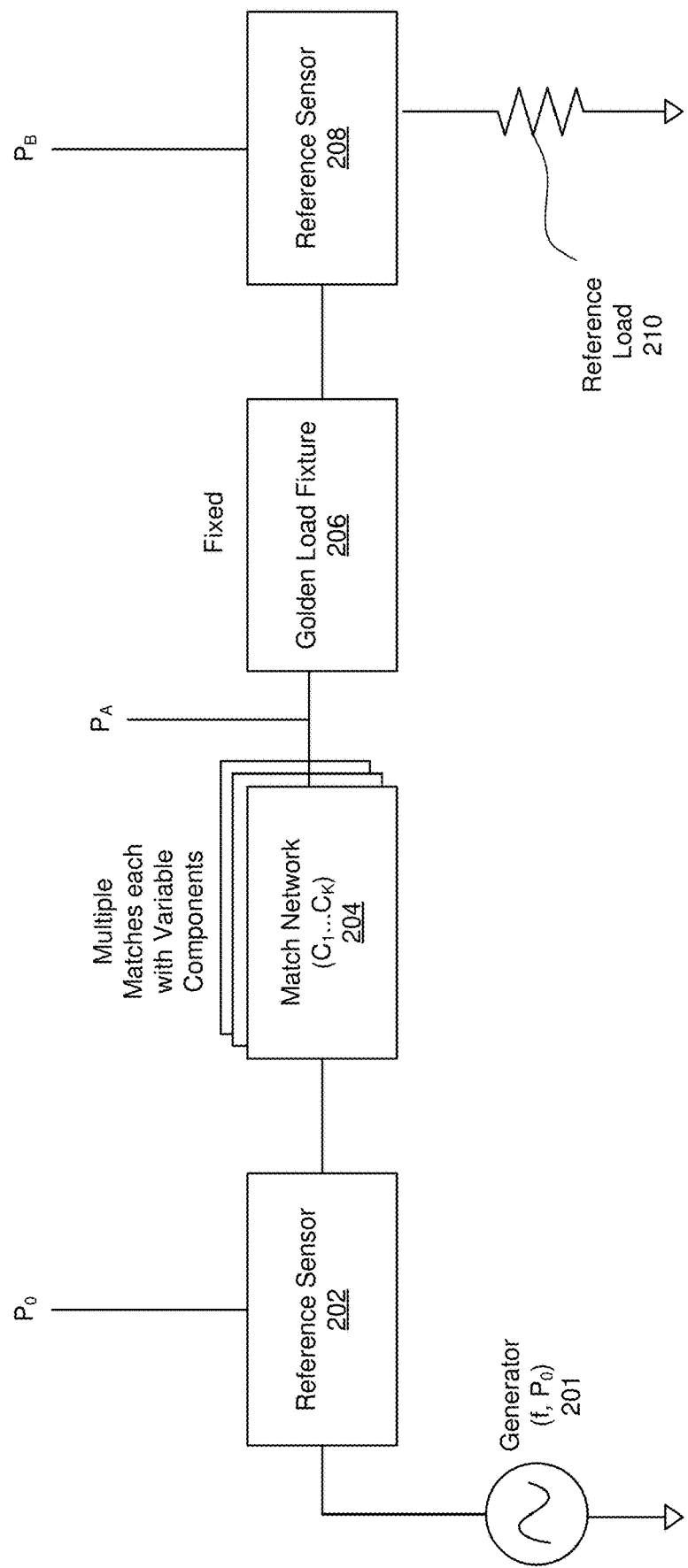
FIG. 2 is an exemplary calibration system for developing an operation model $E\_u(C,f)$ for each of multiple match networks that may be sent with each match network into the field for use during processing recipes to alleviate match deviations from nominal.

Referring to FIG. 2, shown is an exemplary calibration system for developing an operation model E_u(C,f) for each of multiple match networks that may be sent with each match network 204 into the field for use during processing recipes to alleviate match 204 deviations from nominal. In the approach depicted in FIG. 2, a golden load fixture 206 is arranged between an uncalibrated match network 204 and a reference load 210 (e.g., a 50 Ohm circuit). A first reference sensor 202 is coupled between a generator 201 (e.g., a test or calibration generator) and the uncalibrated match network 204. A second reference sensor is coupled between the golden load fixture 206 and the reference load 210. These reference sensors can be stable and highly accurate, especially at the reference load 210. The generator 201 can apply power $P_O$ at a frequency f to the golden load fixture 206 and the reference load 210 via the match network 204, and the match network 204 can tune so that the generator 201 sees an impedance close to the reference load 210. This can involve adjusting internal components described by $C_1$ to $C_K$ of the match network 204, such as variable capacitors. The match network 204 may be designed to operate over a range of frequencies, for instance, but not limited to, 13.56 MHz+/−5%, and the match network 204 can adjust to tune for these changes in generator frequency. The first and second reference sensors 202 and 208 can be used to monitor delivered power, $P_O$, between the generator 201 and the match network 204, and output power $P_B$ between the golden load fixture 206 and the reference load 210. From these two values, $P_O$ and $P_B$, and known efficiencies of the match network 204 and the golden load fixture 206, one can determine the power output from the match network 204, $P_A$. Given a known efficiency of the golden load fixture 206, and these three powers, an efficiency of the match network 204 can be found.

For example, a total efficiency of the calibration system 200 may be calculated as X %*Y %, where X % is the efficiency of the match network 204 and Y % is the efficiency of the golden load fixture 206. Moreover, intermediate power $P_A$, the power applied at the input of the golden load fixture 206, is equal to $P_O$*X %, where $P_O$ or input power is the power applied at the output of the generator 201. Alternatively, intermediate power $P_A$ may be calculated as $P_B$/Y %, where output power $P_B$ is the power applied at the output of the golden load 206. In addition, output power $P_B$ is equal to $P_O$*X % and $P_A$*Y %. Thus, there are many alternative ways to arrive at an efficiency of the match network (X %).

By performing these same steps for M different combinations of generator frequency f and different golden load fixtures 206 and/or variations in the load presented by the golden load fixture 206 resulting from changes to variable components within the golden load fixture 206, a set of M efficiencies for the uncalibrated match network 204 can be determined. These M efficiencies can be inserted into a generalized model E(p,C,f) of the match network where p represents the array of unknown parameters $p_1$ to $p_L$, C represents an array of the match network 204 states $C_1 \ldots C_K$ after tuning, and f is the generator frequency. The parameters $p_1$ to $p_L$ may characterize aspects of the match network 204 such as Q factor of the inductors, characteristics of the vacuum variable capacitors, etc. Since the states $C_1 \ldots C_K$ and the generator frequencies f are known for each of the M combinations, they can also be inserted into the generalized model E(p,C,f) to give M constraints. These constraints can be solved as a system of constraints (e.g., a system of equations) to give estimations of the parameters $p_1$ to $p_L$ thereby forming an operation model E_u(C,f) with the states $C_1 \ldots C_K$ and generator frequency f as inputs, and the parameters $p_1$ to $p_L$ being known values. This solving can seek a precise solution (e.g., solving a linear system) or an estimation (e.g., using least squares method). During production, this operation model E_u(C,f) can be used along with the settings for the match network states $C_1 \ldots C_K$ and the generator frequency to estimate a correction factor ε for the matching network 204 that can be used to control the generator, match, both or some other aspect of the system.

As the match tunes, new correction factors ε can be determined with the operation model $E\_u(C,f)$.

The operation model $E\_u(C,f)$ can be stored in volatile or non-volatile memory in the match network 204, on an internal controller within the match network 204, on an external controller external to the match network 204, or provided to the operator of the plasma processing system in some other form such as a digital file on a flash drive or in an email.

In one embodiment where the operation model $E\_u(C,f)$ gives an efficiency of the match network 204, the operation model $E\_u(C,f)$ may enable the generator 201 to be controlled to compensate for the power loss that is specific to the match network 204. For example, an operator may adjust the power level, $P_0$, of the generator 201 based upon the information about the efficiency of the match network 204. In addition, the power system may include a control interconnect line, such as 330 in FIGS. 3-6, to enable the match network 204 to automatically provide a signal to adjust a setpoint of the generator 201 to account for the specific inefficiency of the match network 204.

The M number of combinations and hence the M number of constraints, is equal to or greater than L, the number of unknown parameters $p_1$ to $p_L$ in the generalized model $E(p,C,f)$.

For the sake of clarity, FIG. 2 has been described in terms of efficiency. However, any number of different characteristics of the match network 204 or its operating state, such as power, efficiency, resistance, reactance, voltage, and current can be used to solve the generalized model and determine an operation model $E\_u(C,f)$ for the corresponding characteristic.

In general, this approach enables a characteristic of an uncalibrated match network 204 (e.g., efficiency) to be calculated over the operating range of the uncalibrated match network 204 using known relationships between a match characteristic measured between the generator and the match network and a match characteristic measured between the golden load fixture and the reference load. The same system and procedure can be used to generate an operation model $E\_u(C,f)$, for each of a plurality of match networks 204 (each of which are of the same model number and thus on paper have identical characteristics, but in practice show difficult-to-characterize deviations from nominal).

In some embodiments the M combinations can be formed via a single golden load fixture 206 and a set of generator frequencies f. In other embodiments, multiple golden load fixtures 206 can be used along with a single generator frequency f, or a set of different generator frequencies f. In yet other embodiments, a single golden load fixture 206, or multiple golden load fixtures 206, can include variable components that can be altered to create different ones of the M combinations. For instance, one or more variable resistors or capacitors could be included in a golden load fixture 206 allowing a single golden load fixture 206 to present multiple load conditions to the match network 204. Regardless of whether the golden load fixture 206 includes variable or fixed components, it is able, to present a consistent reference load to the generator 201 regardless of the match network 204 that is arranged therebetween.

For a particular match network 204 design, the one or more golden load fixtures 206 and test generator frequencies, should be in the match network's 204 operating range and selected so that the resulting measurement under those conditions imposed on the parameters $p_1$ to $p_L$ result in a system with a unique solution.

While referring to FIG. 2, simultaneous reference is made to FIG. 9, which is a table depicting exemplary parameter values produced by one exemplary approach to efficiency characterization (though similar tables could be made and used for other characterizations such as resistance, reactance, power, voltage, and current). As shown, power may be measured at both $P_0$ and $P_B$ across the operating range of the match network 204, and the efficiency of the golden load 206 may be obtained, in order to calculate $P_A$. And once $P_A$ is obtained, in some embodiments, the correction factor equal to $P_A/P_B$ may be obtained. Beneficially, the correction factor may be used to adjust a power setpoint of the generator 201 so that the power applied to the load is maintained at a desired power level.

Figure 6:
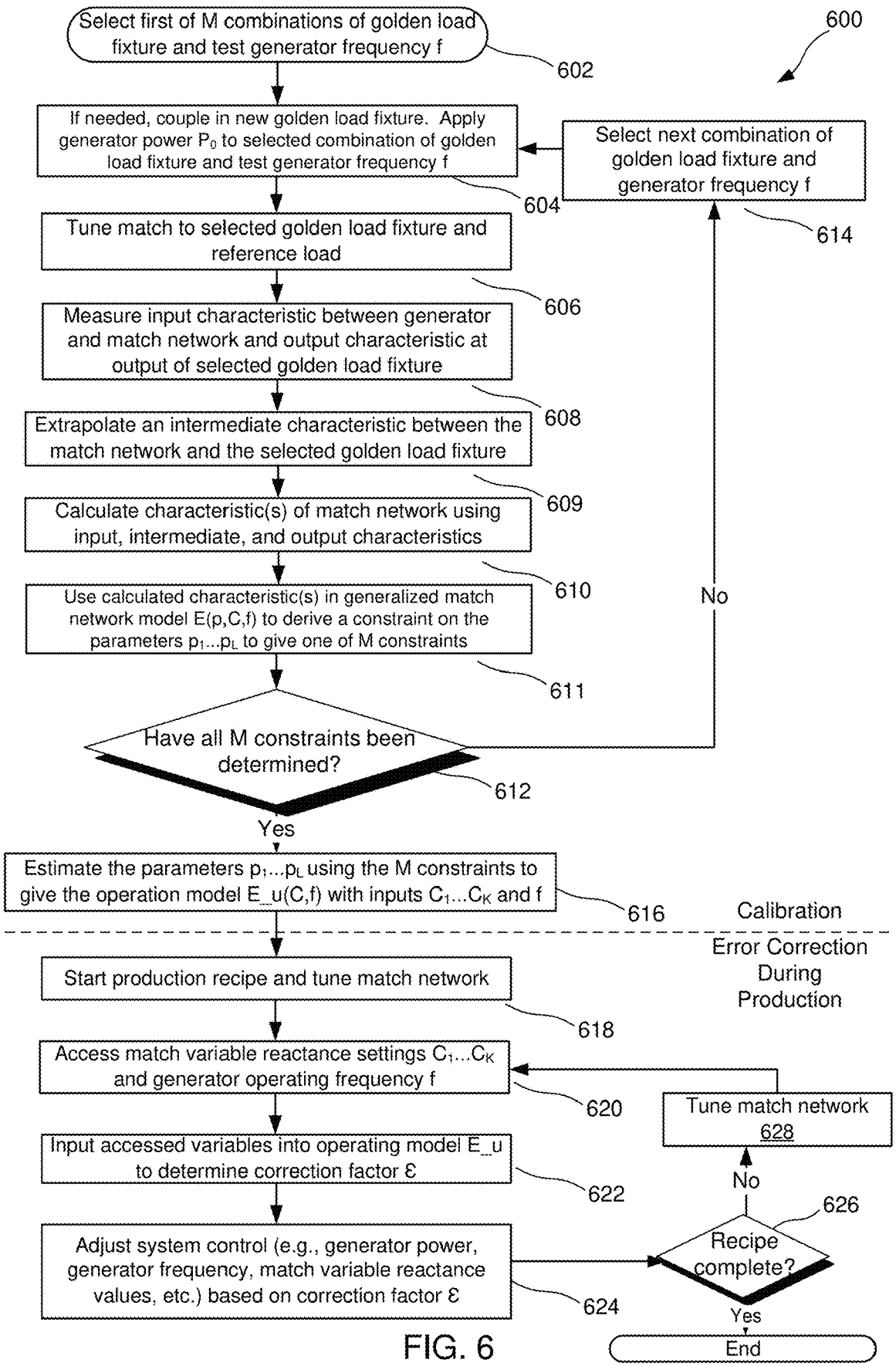
FIG. 6 shown is a flowchart illustrating a method for calibrating one or match networks, or alleviating deviations from nominal for one or more match networks.

Referring next to FIG. 6 shown is a flowchart illustrating a method for calibrating one or match networks, or alleviating deviations from nominal for one or more match networks. Given a generalized model $E(p,C,f)$ of the match network, there are L unknown parameters $p_1$ to $p_L$ and M≥L combinations of golden load fixtures and generator frequencies f used to create a set of M constraints. These M constraints can be solved for the L unknown parameters $p_1$ to $p_L$ to give an operation model $E\_u(C,f)$. This solving can seek a precise solution (e.g., solving a linear system) or an estimation (e.g., using least squares method). The operation model $E\_u(C,f)$ can then be used by a plasma processing system operator or automatically by the system itself to generate a correction factor ε and adjust system controls based on the correction factor ε.

More specifically, a calibration system such as 200 can be setup and a first of M combinations of a golden load fixture and a generator frequency can be selected (Block 602). The M combinations can include any number of golden load fixtures, variations in internal components of one or more golden load fixtures, and generator frequencies. Different golden load fixtures can mean that a new fixture itself is coupled into the system in place of a previous fixture, or that the same fixture's internal components are altered to present a new/next load. Input power $P_0$ is applied to the selected golden load fixture 206 through a transfer system that includes the match network 204 (Block 604). In some implementations, the transmission lines (e.g., coaxial cables) that are coupled to the match network 204 are considered to be a part of the power transfer system so that power losses in the transmission lines are also accounted for. The match network 204 is then tuned to the load presented by the selected golden load fixture 206 and the reference load 210 (Block 606). The first reference sensor 202 can be used to measure input power $P_0$ between the generator 201 and the match network 204 and the second reference sensor 208 can be used to measure output power $P_B$ between the selected golden load fixture 206 and the reference load 210 (Block 608). With the input and output powers, $P_0$ and $P_B$, and an understanding of the efficiency of the match network 204 and/or the efficiency of the selected golden load fixture, an intermediate power, $P_A$, can be extrapolated (Block 609). For instance, if the efficiency of the match network 204 is known, then the intermediate power, $P_A$, can be found as the input power, $P_0$, times the match 204 efficiency. If the efficiency of the golden load fixture 206 is known, then the intermediate power, $P_A$, can be found as the output power, $P_B$, divided by the golden load fixture 206 efficiency. The method 600 then calculates one or more characteristics of the match network 204 using the measured input power $P_0$, intermediate power $P_A$, and output power $P_B$ (Block 610). Efficiency is one characteristic that can be determined in Block 610, though power, resistance, reactance, voltage, and current are other non-limiting characteristics of the match or its state. In some case it may be desirable to determine multiple characteristics in this step. The one or more characteristics can then be used in the generalized match network model E(p,C,f) to derive a constraint on the parameters $p_1$ to $p_L$ of the generalized model to give one of M constraints (Block 611). This operation can be performed before or after the decision 612, and if occurring after, then Decision 612 could look at whether all M combinations have been tested.

If all M characteristics have not yet been determined (i.e., not all M combinations have been tested) (Decision 612=No), then the method 600 selects a next combination of golden load fixture and generator frequency (Block 614) and determines a next one or more characteristics of the match network 204 using this next combination (Blocks 604, 606, 608, 609, 610, and 611). Where the next combination includes a new physical golden load fixture, not just a change in the internal values of a current golden load fixture, then Block 604 includes coupling the new golden load fixture into the system 200 between the match network 204 and the second reference sensor 208.

These determinations of the M constraints continue until all M constraints have been found or all M combinations have been tested (Decision 612=Yes), at which point these M constraints can be used to find a specialized form of the generalized model E(p,C,f) of the match network 204 (Block 616). More specifically, the M constraints can be used to estimate the parameters $p_1$ to $p_L$ in the generalized model E(p,C,f), which has parameters $p_1$ to $p_L$, states $C_1$ to $C_K$, and generator frequency f, where each measurement obtained is a constraint on the parameters $p_1$ to $p_L$. These constraints can be used to estimate all the parameters $p_1$ to $p_L$ to give an operation model E_u(C,f) with inputs of the states $C_1$ to $C_K$ and f (the parameters $p_1$ to $p_L$ are known in the operation model). The operation model E_u(C,f) can be analytical or numerical. With an analytical model, an equation is stored having $C_1 \ldots C_K$ and f as inputs, and this equation is solved for the correction factor ε during production. For the numerical model, a set of values for $C_1 \ldots C_K$ and f are entered into the operation model and numerical solutions are stored in memory. Thus, the numerical model is shipped to customers as an array of correction factors each corresponding to combinations of the inputs $C_1 \ldots C_K$ and f (much like a lookup table), and possibly interpolations between these.

So ends the calibration portion of the method 600 and the match network 204 can now be sent into the field for customer use and the operation model E_u(C,f) can be used to ensure consistent operation across all match networks 204 of the same model. In use, the match networks 204 can now be referred to as calibrated match networks 304 (see FIGS. 3-5).

Figure 3:
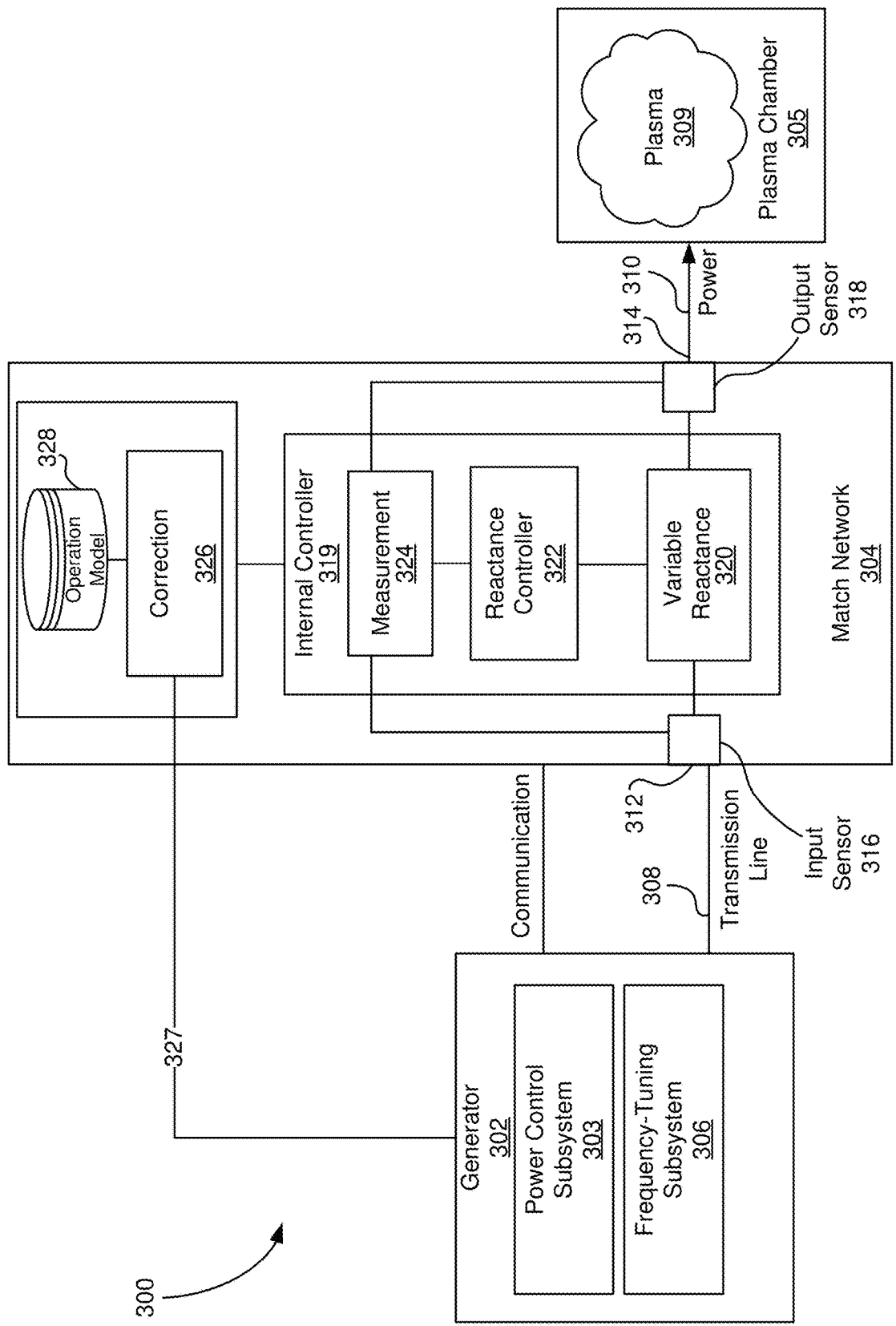
FIG. 3 is an exemplary system incorporating aspects of the operation model $E\_u(C,f)$ discussed herein.
Figure 4:
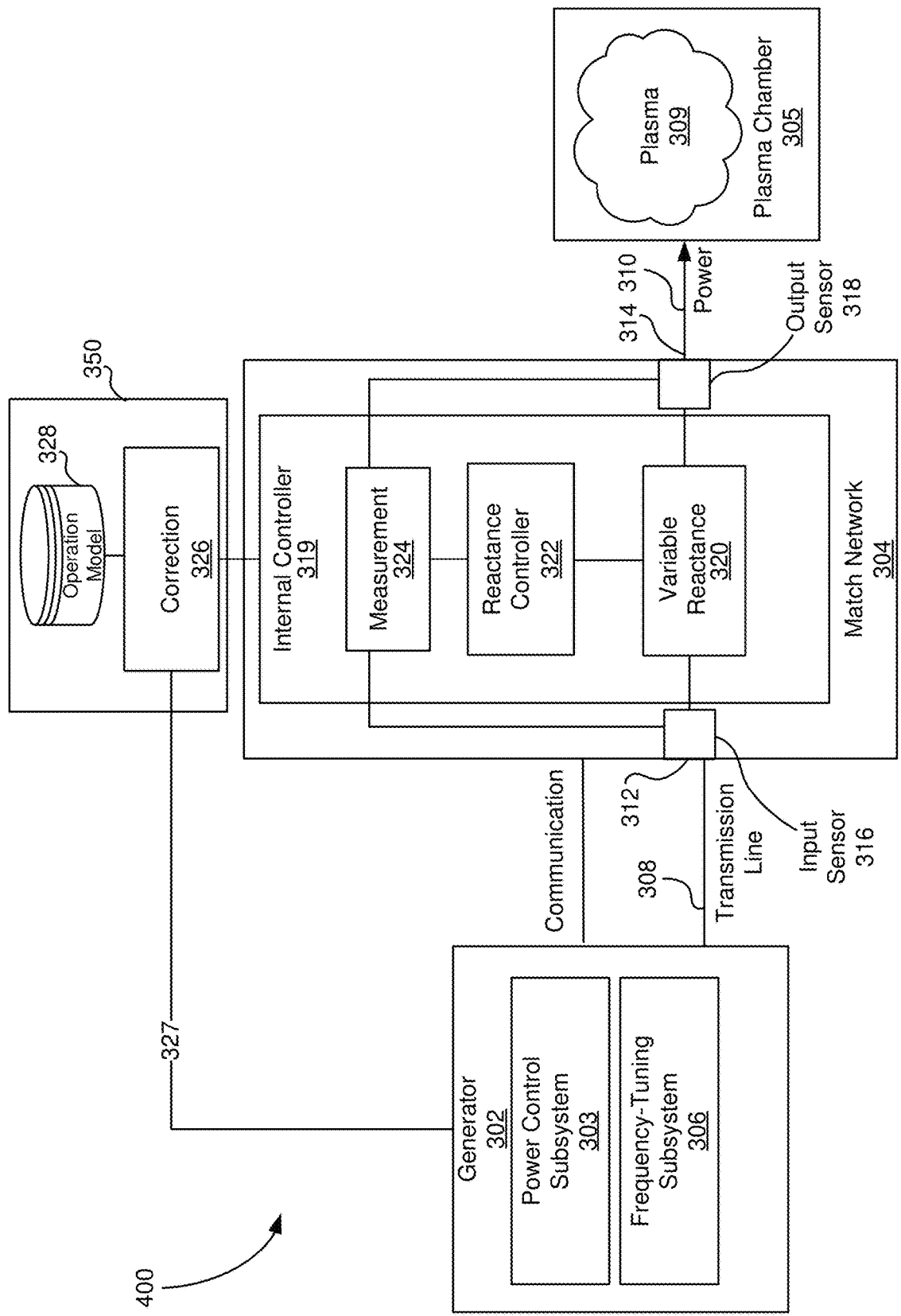
FIG. 4 illustrates an embodiment where both the correction component and the operation model are stored in the external controller.
Figure 5:
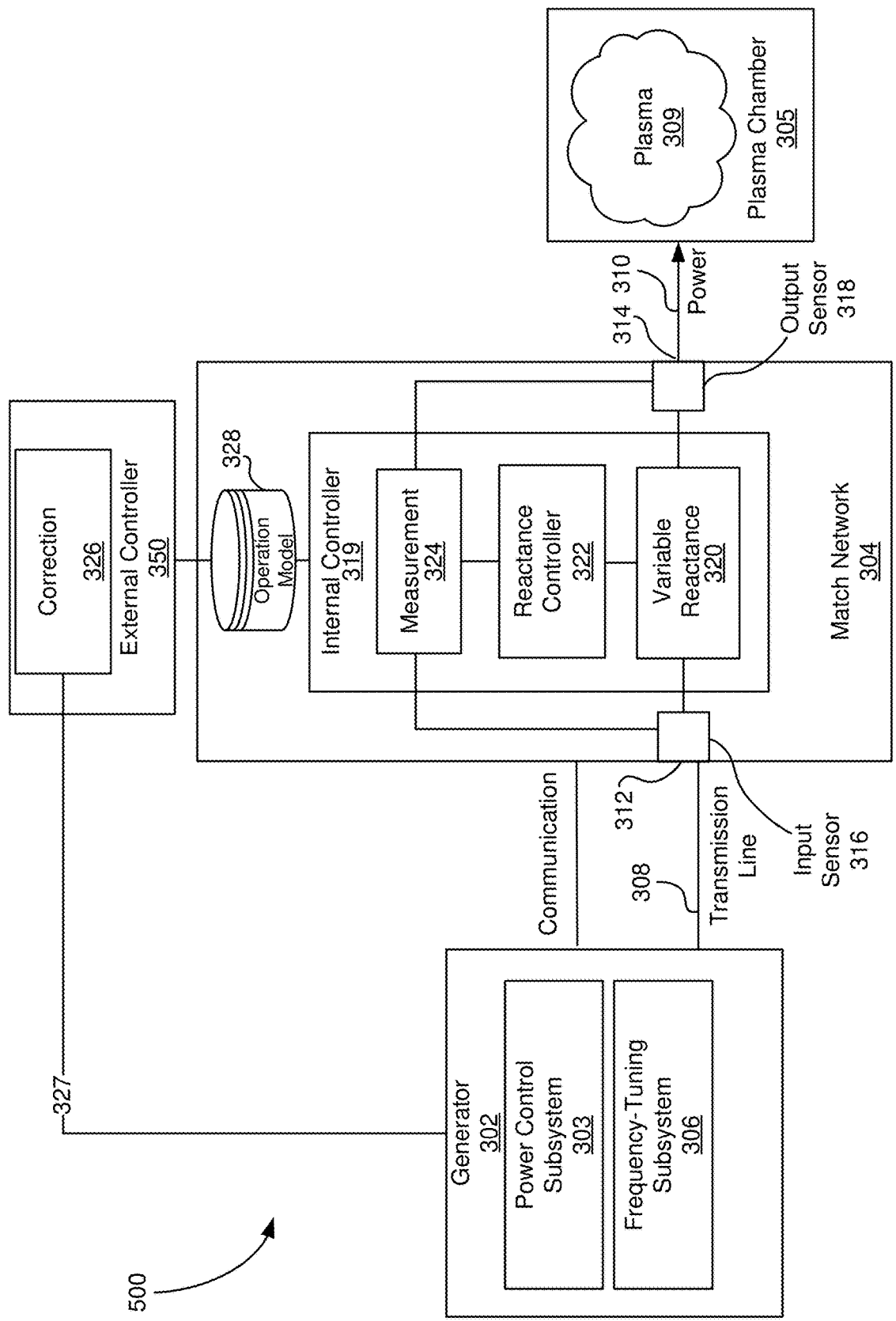
FIG. 5 is a system including an external controller that executes functions of the correction component.

The operation model E_u(C,f) can be stored on volatile or non-volatile memory of the match network 304, an internal controller within the match network 304, or an external controller external to the match network 304. FIGS. 3-5 illustrate examples of these three variations. The unit, comprising the match network and the operation model E_u(C, f), or the match network, the operation model E_u(C,f), and the generator, are then sent to a customer for use in production providing power to a plasma processing chamber. In particular, the match network 304 can be coupled to a process generator, which may or may not be the same test generator 201 used in the calibration of the uncalibrated match network 204. The match network 304 and process generator (e.g., 302 in FIGS. 3-5) can be coupled to a plasma chamber 305 and used to initiate and sustain a plasma 309 via application of generator 302 power to electrodes within the plasma chamber 305. This application of power can be associated with the start of a production recipe and can be followed by tuning of the match network 304 to the plasma load 309 (Block 618). After tuning, the method 600 accesses match network 304 variable reactance settings $C_1$ to $C_K$ and the generator 302 operating frequency f (Block 620), and inputs these into the operation model E_u(C,f) to determine a correction factor ε (Block 622). A controller can adjust aspects of the system 300 such as generator setpoint, generator frequency, match network variable reactance values, and match network impedance to name a few, based on the correction factor ε (Block 624) and the operation model E_u(C,f) can continue to provide new correction factors ε as the match tunes during processing. These corrections to the match network enable greater consistency between calibrated match networks 304 in different systems.

Figure 7:
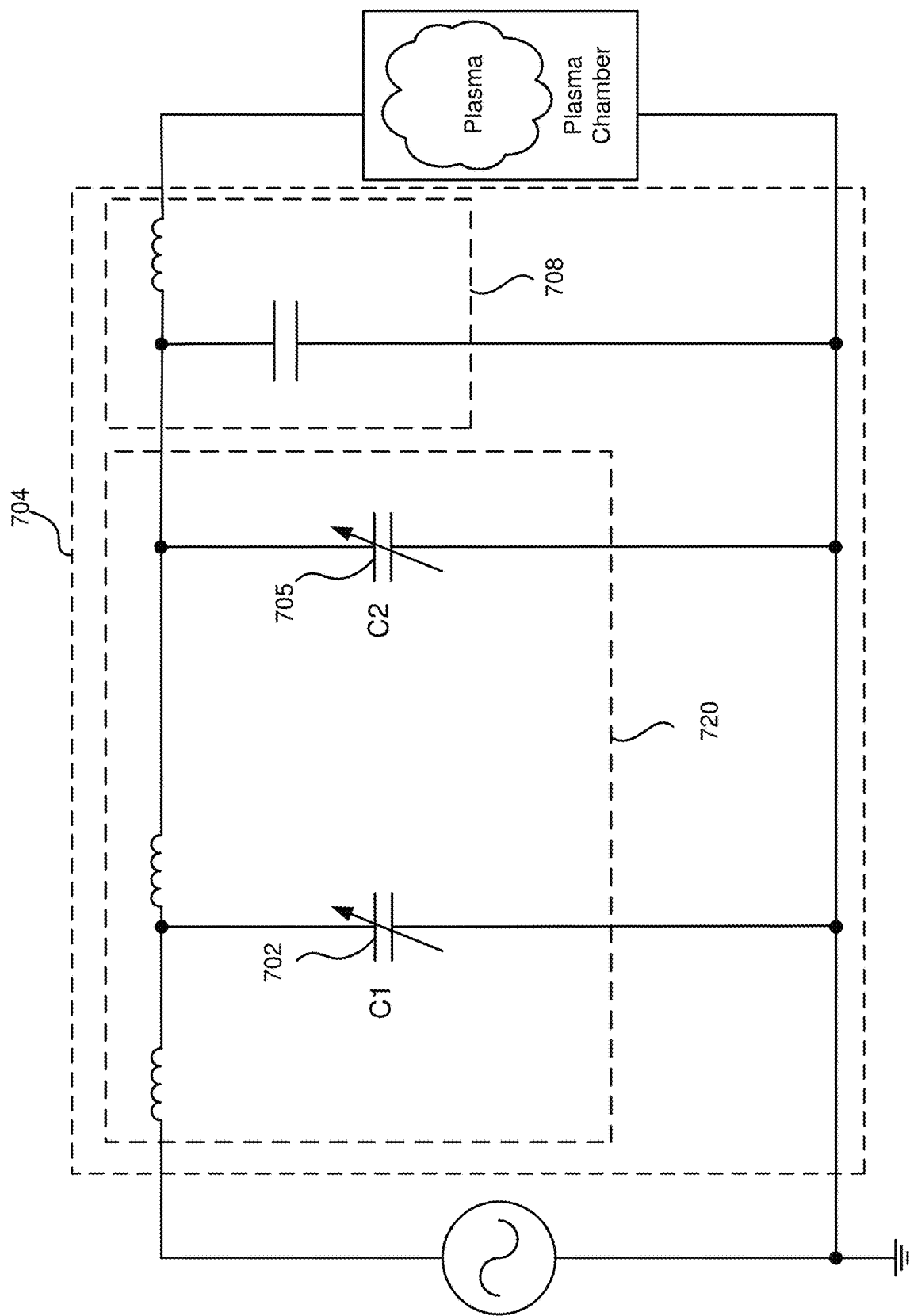
FIG. 7 shown are exemplary match portions that may be used to realize the match networks and described herein.

Referring next to FIG. 7, shown are exemplary match portions that may be used to realize the match networks 204 and 304 described herein. As shown, the match network 204/304 may include a variable reactance section 720 that includes at least two variable reactance elements, such as variable capacitors 702 (C1) and 705 (C2). Each of the variable capacitors 702 and 705 can be realized by typical vacuum variable capacitors or a plurality of switched capacitors. As shown, the variable reactance section 720 can be arranged with a fixed reactance section 708, for instance, comprising, a capacitor and an inductor.

Figure 8:
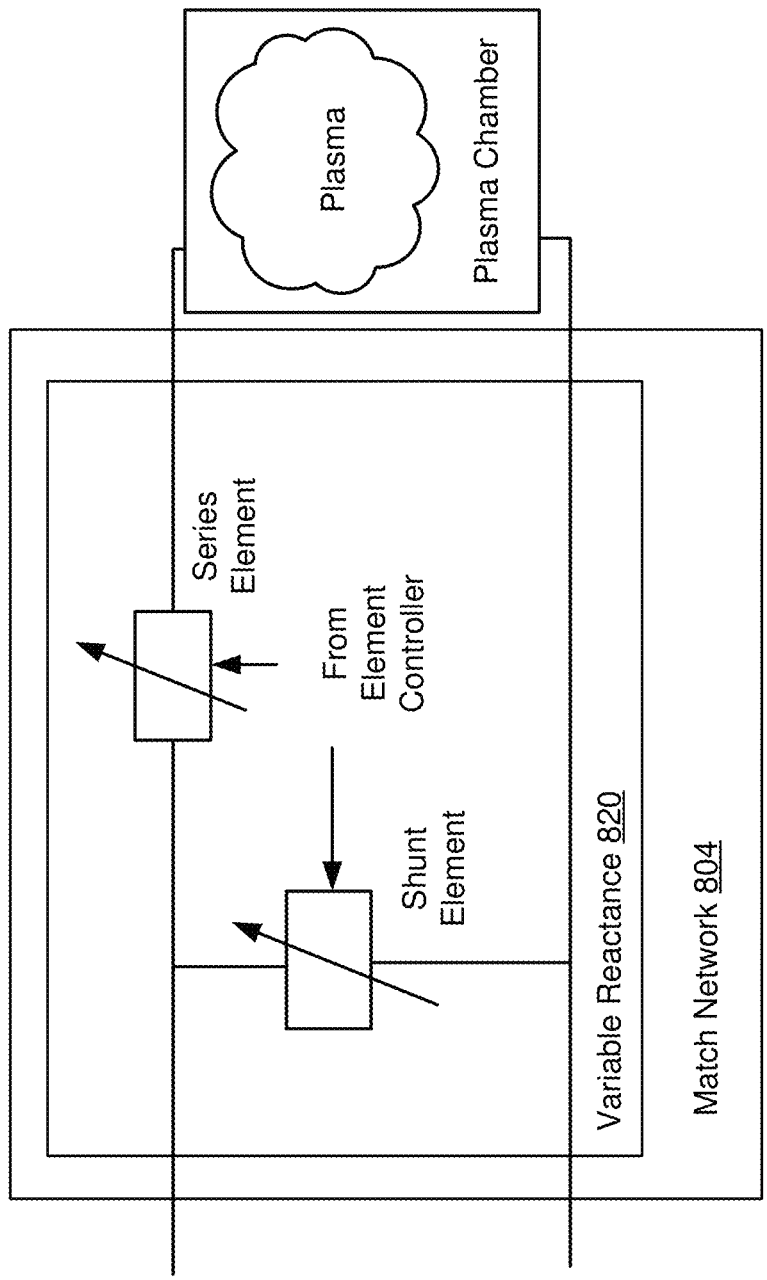
FIG. 8 shown in simplified form, are alternative portions in an alternative topology that may be used in the match network.

Referring next to FIG. 8, shown in simplified form, are alternative portions in an alternative topology that may be used in the match network 804. As shown, a variable reactance section 820 includes a shunt element disposed across transmission lines of the match network 804 and a series element disposed in series along one of the transmission lines. Each of the shunt element and the series element may be coupled to the element controller (not shown) by control lines to enable the element controller to adjust each of the series element and the shunt element. Each of the shunt element and the series element may be realized by one or more reactive elements. The reactive elements, for example, may be variable capacitors, which may be realized by vacuum variable capacitors or a plurality of switched capacitors (that provide a selectable capacitance that can be varied). More specifically, each of the shunt element and the series element may include a vacuum variable capacitor and/or a plurality of switched capacitors.

Referring next to FIG. 3, shown is an exemplary system incorporating aspects of the operation model E_u(C,f) discussed herein. The calibrated match network 304 can include the operation model 328 and a correction component 326, though in other embodiments, both of these components can be external to the match network 304 (see FIG. 4) or the correction component 326 can be external to the match network 304 (see FIG. 5). The operation model 328 can be analytical or numerical. The system 300 can include a generator 302 that may or may not be the same as the test generator 201 used to calibrate the uncalibrated match network 204. The generator 302 can be electrically coupled to a plasma chamber 305 via the match network 304 and transmission line 108 and electrical connection 114. In operation, the generator 302 applies power (e.g., RF power) to the match network 304 via a transmission line 308 (e.g., coaxial cable) and then onto the plasma load 309 via an electrical connection 310. The generator 302 may be realized by a variety of different types of generators that may operate at a variety of different power levels $P_0$ and frequencies f.

The match network 304 includes an input 312 including an electrical connector (not shown) to couple to the generator 302 via the transmission line 308 and an output 314 including an electrical connector (not shown) to couple to the plasma load 309 via the electrical connection 310. As shown, the match network 304 also includes an input sensor 316 and an output sensor 318 that are both coupled to an internal controller 319, which includes a measurement section 324, a reactance controller 322, and a variable reactance section 320 (e.g., 720 in FIGS. 7 and 820 in FIG. 8). The internal controller 319 is an impedance controller that controls to a target impedance at the input sensor 316 using the reactance controller 322 to make adjustments within the match 304.

The plasma load 309 may be a plasma formed in the plasma processing chamber 305, which is known for performing treatments such as the etching of substrates or the deposition of thin layers upon substrates. The plasma load 309 is typically achieved by the formation of plasmas within low pressure gases. The plasma 309 is initiated and sustained by the generator 302 (and potentially additional generators), and the match network 304 is employed to ensure the generator 302 sees a desired impedance (typically, although not always, 50 ohms) at the output of the generator 302.

The generator 302 may apply RF power to the plasma load 309 by a conventional 13.56 MHz signal, but other frequencies may also be utilized such as, but not limited to, 400 kHz, 1 MHz, 2 MHz, or 60 MHz. The generator 302 may have a source impedance of 50 ohms and an output stage to match the source impedance of the generator 302 to the impedance of the transmission line 308, which may be a typical transmission line (such as a 50 ohm coaxial cable).

In general, the match network 304 functions to transform an impedance at the output 314 of the match network 304 to an impedance that is presented to the transmission line 308 at an input 312 of the match network 304. More specifically, within the match network 304, the variable reactance section 320 functions to transform the impedance at the output 314 of the match network 304 to an input-impedance that is presented to the transmission line 308 at an input of the match network 304. More particularly, as those of ordinary skill in the art will readily appreciate, the measurement section 324 may receive signals from the input sensor 316 that are indicative of electrical parameter values at the input 312 of the match network. In turn, the measurement section 324 may provide one or more processed signals to the reactance controller 322, which controls a setting of the variable reactance section 320, and hence, the internal electrical elements (e.g., variable reactance elements) such that the input impedance of the match network 304 is close to a desired input impedance (e.g., close to 50 ohms).

The reactance controller 322 may implement a conventional feedback loop to control the variable reactance section 320 to minimize reflected RF power, but reflected power need not be minimized, and in some instances, it is desirable to control the variable reactance section 320 based on another parameter (e.g., a reflection coefficient) and/or to minimize instabilities.

The input sensor 316 and/or the output sensor 318 may be realized by a conventional dual directional coupler (known to those of ordinary skill in the art) that includes sensing circuitry that provides outputs indicative of forward and reflected power at the input of the match network 304. The input sensor 316 and/or the output sensor 318 may also be realized by a conventional voltage-current (V/I) sensor (known to those of ordinary skill in the art) that includes sensing circuitry that provides outputs indicative of voltage, current, and a phase between the voltage and current. As an example, a directional coupler may be used to realize the input sensor 316 and a V/I sensor may be used to realize the output sensor 318. Other embodiments may see the input sensor 316 and/or the output sensor 318 realized by a voltage or current sensor (known to those of ordinary skill in the art) that includes sensing circuitry that provides outputs indicative of voltage or current. Moreover, each of the input sensor 316 output sensor 318 may be realized by more than one separate sensors (e.g., a separate voltage sensor and a separate current transducer). In other words, although a single block is depicted for each of the input and output sensors 316, 318, the single blocks each represent one or more sensors.

The measurement section 324 may include processing components to sample, filter, and digitize the outputs of the input sensor 316 for utilization by the reactance controller 320. It is also contemplated that signals from the output sensor 318 may be utilized to control the variable reactance section 320. In any event, the reactance controller 322 may adjust the variable reactance component 320 to transform the impedance at the output 314 of the match network 314 to the desired impedance (e.g., 50 ohms) at the input 312 of the match network. Because an impedance of the plasma load 309 tends to vary during processing of a workpiece (e.g., a substrate), the reactance controller 322 may operate to adjust the variable reactance section 320 to change its impedance to compensate for fluctuations in the impedance of the plasma load 309.

As shown, the match network 304 includes an efficiency correction component 326 in communication with both an internal controller 319 of the match network 304 and the operation model 328. As discussed above, the operation model 328 characterizes the match network 304 over the operating range of the match network 304 in terms of values indicative of a characteristic of the match network 304 (e.g., efficiency, power, resistance, reactance, voltage, or current). Further any two or more of these characteristics of the match network 304 can be considered in combination. Thus, on an ongoing basis (as load 309 impedance changes and the settings of the match network 304 change), the correction component 326 may receive the match settings, $C_1$ to $C_K$, and generator frequency, f, from the internal controller 319 and/or the generator 302 and apply these to the operation model $E\_u(C,f)$ 328 to generate a correction factor $\varepsilon$.

In turn, the correction factor $\varepsilon$ may be displayed and/or used to correct the setpoint of the generator 302 via a power control subsystem 303. As shown in FIG. 3, for example, a setpoint correction factor (GSCF) may be sent to the generator 302 via a control interconnect line 327. FIG. 9 depicts exemplary GSCF values that may be used to adjust the setpoint of the generator 302 so that the power applied to the plasma load 309 is maintained at a desired level. In other examples, the correction component 326 may instruct the generator 302 to alter the generator frequency f via a frequency-tuning subsystem 306, which may or may not occur in tandem with adjustment to the setpoint. Alternatively, the control component 326 can send an instruction or the correction factor $\varepsilon$ to the internal controller 319 to vary the variable reactance 320.

In variations of the embodiment depicted in FIG. 3, it may be beneficial to distribute one or more of the components of the match network 304, so other configurations are certainly contemplated. For example, one or both of the input sensor 316 and output sensor 318 may be located outside of the match network 304. As another example, the input sensor 316 may reside within the generator 302 and the generator 302 may provide a signal indicative of electrical parameters at the output of the generator 302 to the measurement section 324. Moreover, one or more of the components of the internal controller (e.g., one or more of the measurement component 324 and/or the reactance controller 322) may be located apart from the match network 304.

The depiction of the operation model 328 residing within the match network 304 is merely an example intended to provide an introduction to the operation model 328. It should be recognized, as described further herein, that the operation model 328 may also reside within the generator 302, or in the alternative, the operation model 328 may reside within a centralized controller. In yet other implementations, the operation model 328 may be distributed among two or more of the generator 302, the match network 304, and the central controller. In some cases, the correction component 326 and the operation model 328 can be arranged within the same device as in FIGS. 3 and 5, and in others they can be remote from each other as in FIG. 5.

It should also be recognized that the control interconnect 327 is not utilized in all implementations. For example, the information about the correction factor may simply be provided via a display of the match network 304 to an operator of the match network 304. In addition, the match network 304 may provide an output to another centralized controller that is coupled to the generator 302. Various other alternative implementations are discussed further herein.

Aspects disclosed herein include details about characterizing match networks to produce operation models such as an efficiency model (e.g., before the match networks are released to customers) and details about operation when the match networks are deployed in actual use.

By way of further example, it should also be recognized that the components of the match network 304 are depicted as logical components and that the depicted components may be realized by common constructs (e.g., a common central processing unit and non-volatile memory) that are closely integrated, or the depicted components may be further distributed. For example, the functionality of the measurement section 324 may be distributed between the input sensor 316 and the output sensor 318 so that signals output from the input sensor 316 and/or output sensor 318 are digital signals that have been processed and digitalized in close connection with the sensors 316, 318, which enables the reactance controller 322 to directly receive processed signals from the sensors 316, 318. The specific examples of the distribution of the depicted functions are not intended to be limiting because it is certainly contemplated that various alternatives may be utilized depending upon the type of hardware that is selected and the extent to which software (e.g., embedded software) is utilized.

It should also be recognized that neither the operation model 328 nor the correction component 326 need be located within the match network 304. Referring next to FIG. 5 for example, shown is a system including an external controller 350 that executes functions of the correction component 326. The external controller 350 may be realized by hardware or hardware in connection with software, and the external controller 350 may be coupled to several components of a plasma processing system including the generator 302, match network 304, equipment coupled to the plasma chamber 305, other generators, mass flow controllers, etc. Although not depicted in FIG. 5, it is also contemplated that the operation model 328 may be stored in the external controller 350, and the external controller 350 may receive match-setting information and/or load impedance information to access and utilize the operation model 328. For instance, FIG. 4 illustrates an embodiment where both the correction component 326 and the operation model 328 are stored in the external controller 350.

FIG. 9 illustrates a table of exemplary values measured and calculated where the characteristic of the match network was efficiency. The first reference sensor measured 1000 W for the input power $P_0$ for all combinations. The golden load fixture has a known efficiency of 97.00% and the output power $P_B$ measured by the second reference sensor between the golden load fixture and the reference load is shown in the second column, with values between 815 W and 825 W. From the input and output powers, $P_0$ and $P_B$, and the known efficiency of the golden load fixture, the intermediate power $P_A$ between the uncalibrated match network and the golden load fixture can be calculated and is shown in the fourth column. These values range from 840.2 W to 850.5 W. From these three power values, the match efficiency can be determined as seen in column 5, and from this a correction factor is determined in the last column as the averaged modeled power (or nominal power)/intermediate power $P_A$.

Figure 10:
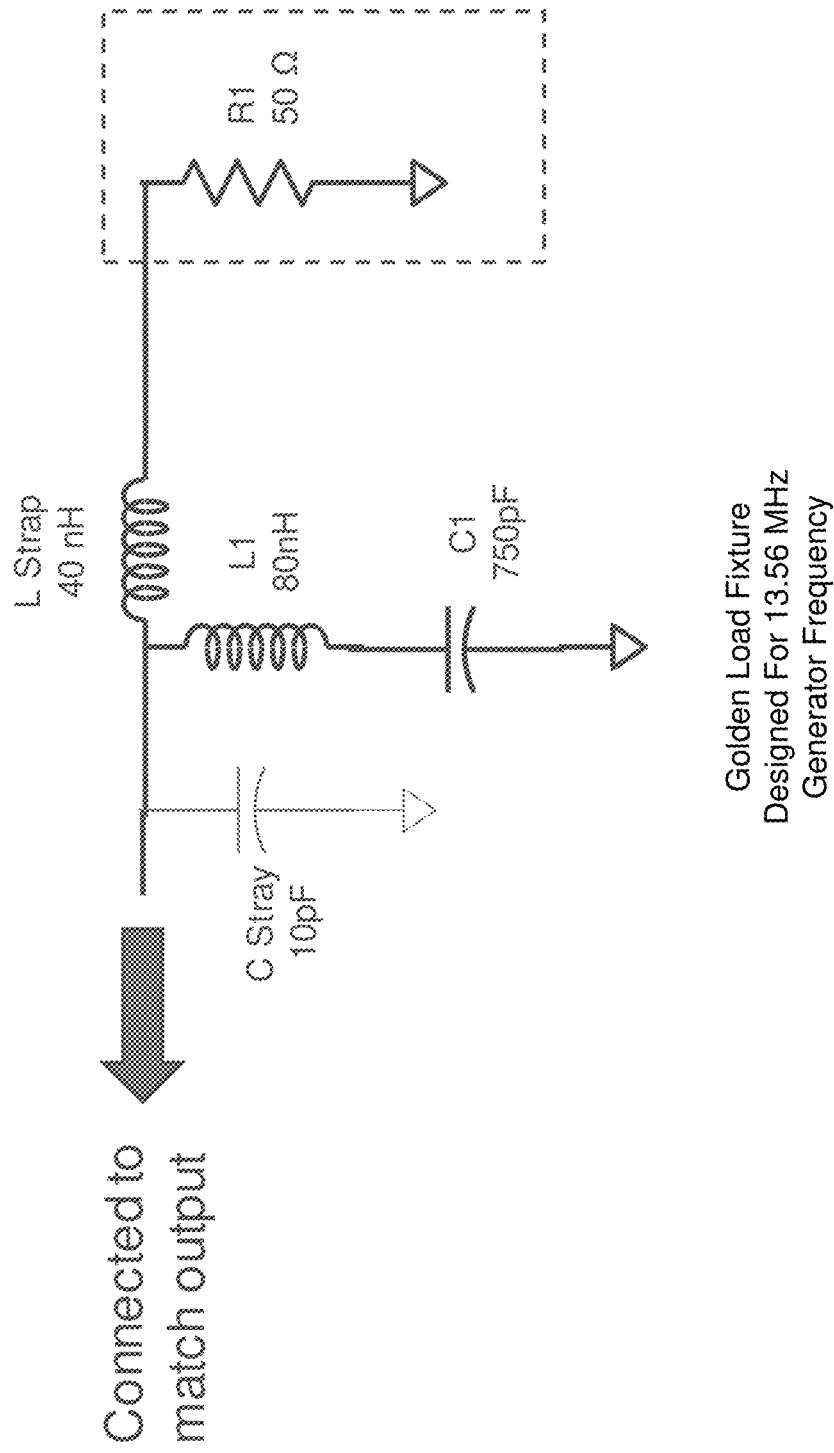
FIG. 10 illustrates an exemplary embodiment of a golden load fixture designed for a first generator frequency.
Figure 11:
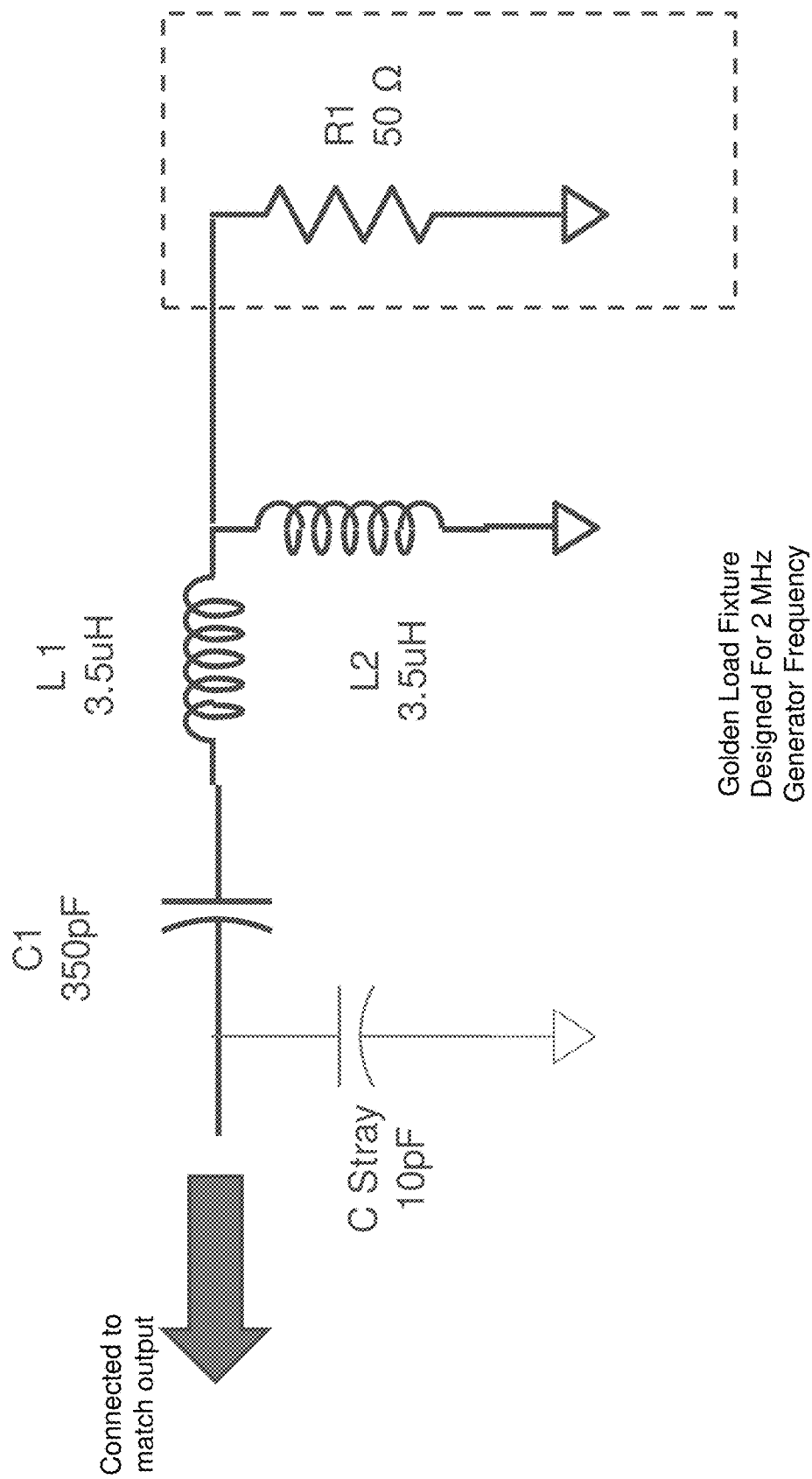
FIG. 11 illustrates an exemplary embodiment of a golden load fixture designed for a second generator frequency.

FIGS. 10 and 11 illustrate two exemplary embodiments of golden load fixtures designed for different generator frequencies. Both include a set of inductive and capacitive components arranged in series and parallel to present a desired complex impedance to a match network to be coupled to the golden load fixture.

Figure 12:
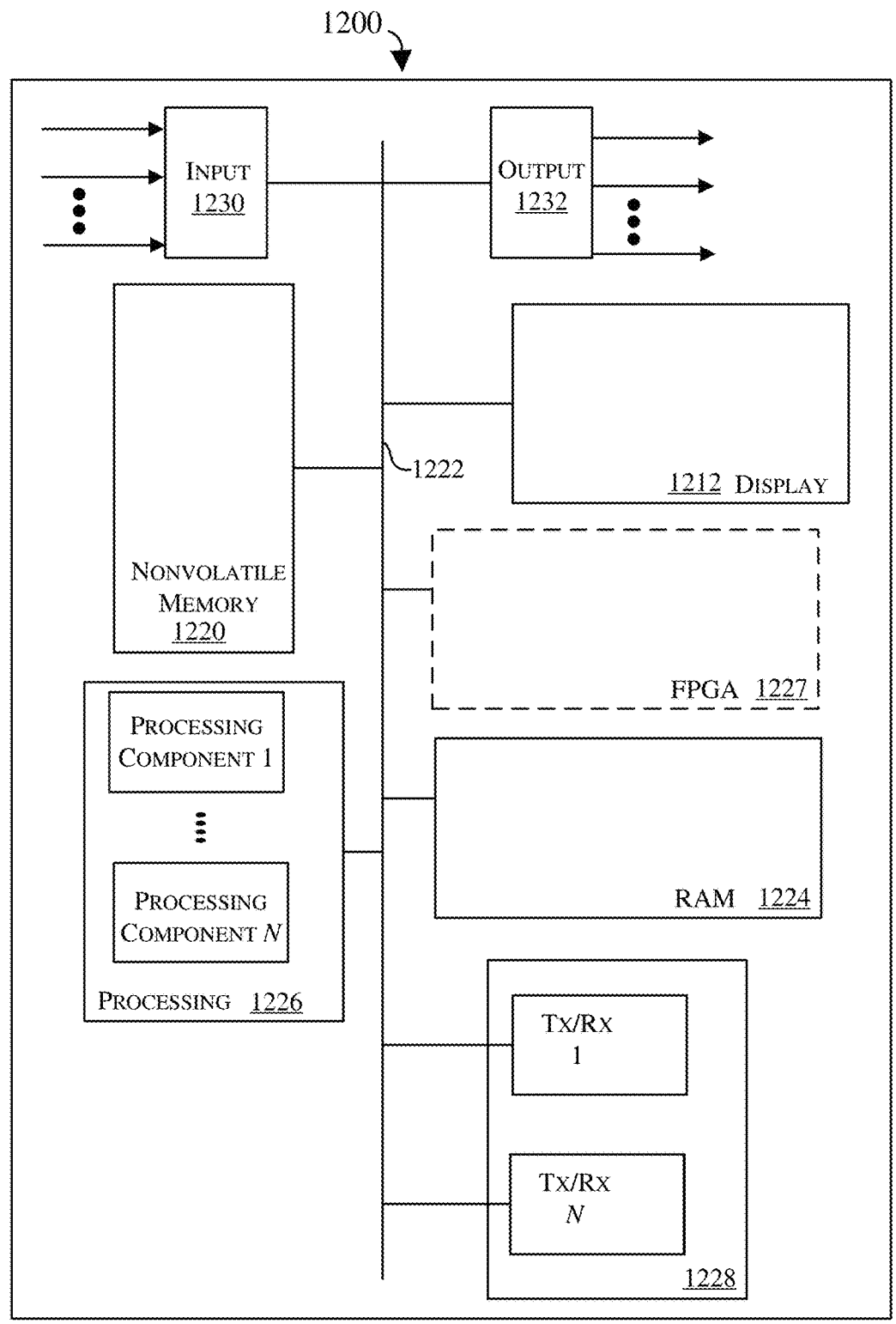
FIG. 12 is a block diagram depicting physical components that may be utilized to realize components of the match networks and external controller disclosed herein.

The methods described in connection with the embodiments disclosed herein may be embodied directly in hardware, in processor executable instructions encoded in non-transitory computer readable medium, or in a combination of the two. Referring to FIG. 12 for example, shown is a block diagram depicting physical components that may be utilized to realize components of the match networks 304, correction component 326, and operation model 328 disclosed herein. As shown, in this embodiment a display portion 1212 and nonvolatile memory 1220 are coupled to a bus 1222 that is also coupled to random access memory ("RAM") 1224, a processing portion (which includes N processing components) 1226, a field programmable gate array (FPGA) 1227, and a transceiver component 1228 that includes N transceivers. Although the components depicted in FIG. 12 represent physical components, FIG. 12 is not intended to be a detailed hardware diagram; thus, many of the components depicted in FIG. 12 may be realized by common constructs or distributed among additional physical components. Moreover, it is contemplated that other existing and yet-to-be developed physical components and architectures may be utilized to implement the functional components described with reference to FIG. 12.

This display 1212 generally operates to provide a user interface for an operator of the match networks 204, 304, and in several implementations, the display 1212 is realized by a touchscreen display. The display be used to realize, in part, a reporting section to report efficiency information. In general, the nonvolatile memory 1220 is non-transitory memory that functions to store (e.g., persistently store) data and machine readable (e.g., processor executable) code (including executable code that is associated with effectuating the methods described herein). In some embodiments for example, the nonvolatile memory 1220 includes bootloader code, operating system code, file system code, and non-transitory processor-executable code to facilitate the execution of the methods described herein. The display 1212 may be a part of the match networks 204, 304 or may be remote therefrom, for instance the display of a hand-held device that an operator uses to remotely control the matches 204, 304.

In many implementations, the nonvolatile memory 1220 is realized by flash memory (e.g., NAND or ONENAND memory), but it is contemplated that other memory types may be utilized as well. Although it may be possible to execute the code from the nonvolatile memory 1220, the executable code in the nonvolatile memory is typically loaded into RAM 1224 and executed by one or more of the N processing components in the processing portion 1226.

In operation, the N processing components in connection with RAM 1224 may generally operate to execute the instructions stored in nonvolatile memory 1220 to realize the functionality of the match networks 204 and 304 including the correction component 326. For example, data from the operation model 328 and non-transitory processor-executable instructions to effectuate the methods described herein may be persistently stored in nonvolatile memory 1220 and executed by the N processing components in connection with RAM 1224. As one of ordinarily skill in the art will appreciate, the processing portion 1226 may include a video processor, digital signal processor (DSP), graphics processing unit (GPU), and other processing components.

In addition, or in the alternative, the field programmable gate array (FPGA) 1227 may be configured to effectuate one or more aspects of the methodologies described herein. For example, non-transitory FPGA-configuration-instructions may be persistently stored in nonvolatile memory 1220 and accessed by the FPGA 1227 (e.g., during boot up) to configure the FPGA 1227 to effectuate one or more functions the match networks 204 and 304 and/or correction component 326.

The input component 1230 may operate to receive signals (e.g., from the input sensor 316 and/or the output sensor 318) that are indicative of one or more parameters at the first and second sides of the match networks 204 and 304. The signals received at the input component may include, for example, voltage, current, forward power, reflected power and impedance. The output component 1232 generally operates to provide one or more analog or digital signals to effectuate an operational aspect disclosed herein. For example, the output component 1232 may provide control signals to the capacitors C1 and C2 to control the setting of the match network 204 and 304.

The depicted transceiver component 1228 includes N transceiver chains, which may be used for communicating with external devices via wireless or wireline networks. Each of the N transceiver chains may represent a transceiver associated with a particular communication scheme (e.g., WiFi, Ethernet, Profibus, etc.).

It should be recognized that technologies other than those depicted in FIG. 12 may be utilized instead of, or in addition to, the technologies depicted in FIG. 12. For example, the various illustrative logical blocks, modules, and circuits described in connection with the embodiments disclosed herein may be implemented or performed with an application specific integrated circuit (ASIC), programmable logic device, discrete gate or transistor logic, discrete hardware components, or any combination thereof designed to perform the functions described herein.

Some portions are presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm is a self-consistent sequence of operations or similar processing leading to a desired result. In this context, operations or processing involves physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

As used herein, the recitation of "at least one of A, B and C" is intended to mean "either A, B, C or any combination of A, B and C." The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. A system comprising:
   a generator;
   a match network u comprising:
   an input coupled to the generator;
   an output configured for electrical coupling to a plasma load within a plasma chamber; and
   variable reactance components with variable positions described by states, $C_1$ to $C_K$;
   an operation model, $E\_u(C,f)$, characterizing a deviation from nominal of the match network u over its operating range, the operation model, $E\_u(C,f)$, having parameters, $p_1$ to $p_L$, determined via calibration using one or more golden load fixtures, the states, $C_1$ to $C_K$, and one or more generator frequencies, f;
   a correction component configured to, during a processing recipe of the generator and the match network u:
   access an operating frequency, f', of the generator;

access the states, $C_1$ to $C_K$, after the match network u has been tuned for the plasma load;

input the operating frequency, f, as well as the states, $C_1$ to $C_K$, to the operation model, E_u(C,f), to generate a correction factor ε; and instruct the generator and/or match network u to adjust based on the correction factor ε.

2. The system of claim 1, wherein the correction component is arranged within the match network u.

3. The system of claim 2, wherein the operation model is arranged within the match network u.

4. The system of claim 2, wherein the operation model is arranged external to the match network u.

5. The system of claim 1, wherein the correction component is arranged external to the match network u.

6. The system of claim 5, wherein the operation model is arranged within the match network u.

7. The system of claim 5, wherein the operation model is arranged external to the match network u.

8. The system of claim 7, wherein the correction component and the operation model are arranged in the generator.

9. The system of claim 1, wherein the one or more golden load fixtures is a single golden load fixture with variable reactance components.

10. The system of claim 1, wherein the pre-processing calibration involves developing a set of M constraints by, for M combinations of the one or more golden load fixtures and frequencies f, of a test generator for each of the M combinations:

applying power from the test generator to a selected golden load fixture through the match network at a selected one of the frequencies f;

tuning the match network to the selected golden load fixture;

measuring an input characteristic between the generator and the match network;

measuring an output characteristic after the selected golden load fixture;

given known resistance and reactance of the selected golden load fixture and the model of the match network, extrapolating an intermediate characteristic between the match network and the selected golden load fixture;

calculating a characteristic of the match network for a selected one of the combinations based on the input characteristic, the intermediate characteristic, and the output characteristic; and using the characteristic of the match network for the selected one of the combinations to form one of the M constraints.

11. The system of claim 10, wherein the test generator is the generator.

12. The system of claim 10, wherein the characteristic of the match network is selected from a group selected from: power, efficiency, resistance, reactance, voltage, current.

13. The system of claim 1, wherein additional correction factors ε are determined from the operation model E_u(C,f) as the match network continues to tune.

14. A non-transitory, tangible computer readable storage medium, encoded with processor readable instructions to perform a method for identifying M constraints that can be used to form an operation model of a match network that accounts for variances from nominal, the method comprising, for M combinations of golden load fixtures and test generator frequencies f, generating a set of M constraints by:

applying power from the test generator to a selected one of the golden load fixtures through a match network at a selected one of the frequencies f;

tuning the match network to the selected one of the golden load fixtures and a reference load;

measuring an input characteristic between the test generator and the match networks;

measuring an output characteristic after the selected one of the golden load fixtures;

using the input and output characteristics to extrapolate an intermediate characteristic between the match network and the selected one of the golden load fixtures;

calculating one or more characteristics of the match network for a selected one of the M combinations based on the input characteristic, the intermediate characteristic, and the output characteristic.

15. A method comprising:

for M combinations of golden load fixtures and test generator frequencies f, generating a set of M constraints by:

applying power from the test generator to a selected one of the golden load fixtures through a match network at a selected one of the frequencies f;

tuning the match network to the selected one of the golden load fixtures in series with a reference load;

measuring an input characteristic between the test generator and the match network;

measuring an output characteristic after the selected one of the golden load fixtures;

using the input and output characteristics to extrapolate an intermediate characteristic between the match network and the selected one of the golden load fixtures;

calculating one or more characteristics of the match network for a selected one of the M combinations based on the input characteristic, the intermediate characteristic, and the output characteristic; and using the one or more characteristics of the match network for the selected one of the M combinations to form one of the M constraints.

16. The method of claim 15, wherein the one or more characteristics of the match network is an efficiency of power transfer.

17. The method of claim 15, wherein the one or more characteristics of the match network is selected from a group selected from: power, resistance, reactance, voltage, and current.

* * * * *